United States Patent
Weissman et al.

(10) Patent No.: US 7,711,070 B2
(45) Date of Patent: May 4, 2010

(54) METHOD AND APPARATUS FOR CONTROL OF TRANSMITTER POWER CONSUMPTION

(75) Inventors: Haim Weissman, Haifa (IL); Yuval Carmel, Kiriat Bialik (IL)

(73) Assignee: QUALCOMM, Incorporated, San Diego, CA (US)

( * ) Notice: Subject to any disclaimer, the term of this patent is extended or adjusted under 35 U.S.C. 154(b) by 675 days.

(21) Appl. No.: 11/509,295

(22) Filed: Aug. 23, 2006

(65) Prior Publication Data

US 2007/0171997 A1   Jul. 26, 2007

Related U.S. Application Data

(60) Provisional application No. 60/711,541, filed on Aug. 25, 2005, provisional application No. 60/740,038, filed on Nov. 28, 2005.

(51) Int. Cl.
*H04L 25/03* (2006.01)
(52) U.S. Cl. ..................................... 375/297
(58) Field of Classification Search ................. 375/219, 375/297; 455/127, 522; 330/133
See application file for complete search history.

(56) References Cited

U.S. PATENT DOCUMENTS

| | | | |
|---|---|---|---|
| 6,265,935 B1 * | 7/2001 | Kaneda et al. | 330/51 |
| 6,304,139 B1 * | 10/2001 | Kanno | 330/133 |
| 6,327,462 B1 | 12/2001 | Loke et al. | |
| 6,498,925 B1 * | 12/2002 | Tauchi | 455/115.1 |
| 6,563,883 B1 * | 5/2003 | Leinonen et al. | 375/295 |
| 2001/0034217 A1 | 10/2001 | Loke et al. | |
| 2004/0213335 A1 | 10/2004 | Forest et al. | |

* cited by examiner

*Primary Examiner*—Don N Vo
(74) *Attorney, Agent, or Firm*—Andrea L. Mays; Ramin Mobarhan

(57) ABSTRACT

A method and apparatus improve the design and control of amplification stages in a radio frequency (RF) transmitter, so as to reduce its power consumption. In some aspects, the transmitter is operable to transmit an output RF signal at a target power level, which may vary over a wide dynamic range. For each target power level in the dynamic range, a control module in the transmitter configures operational settings of amplification stages of the transmitter in order to produce the output RF signal having the appropriate target power level, while consuming minimal power from the power source.

22 Claims, 8 Drawing Sheets

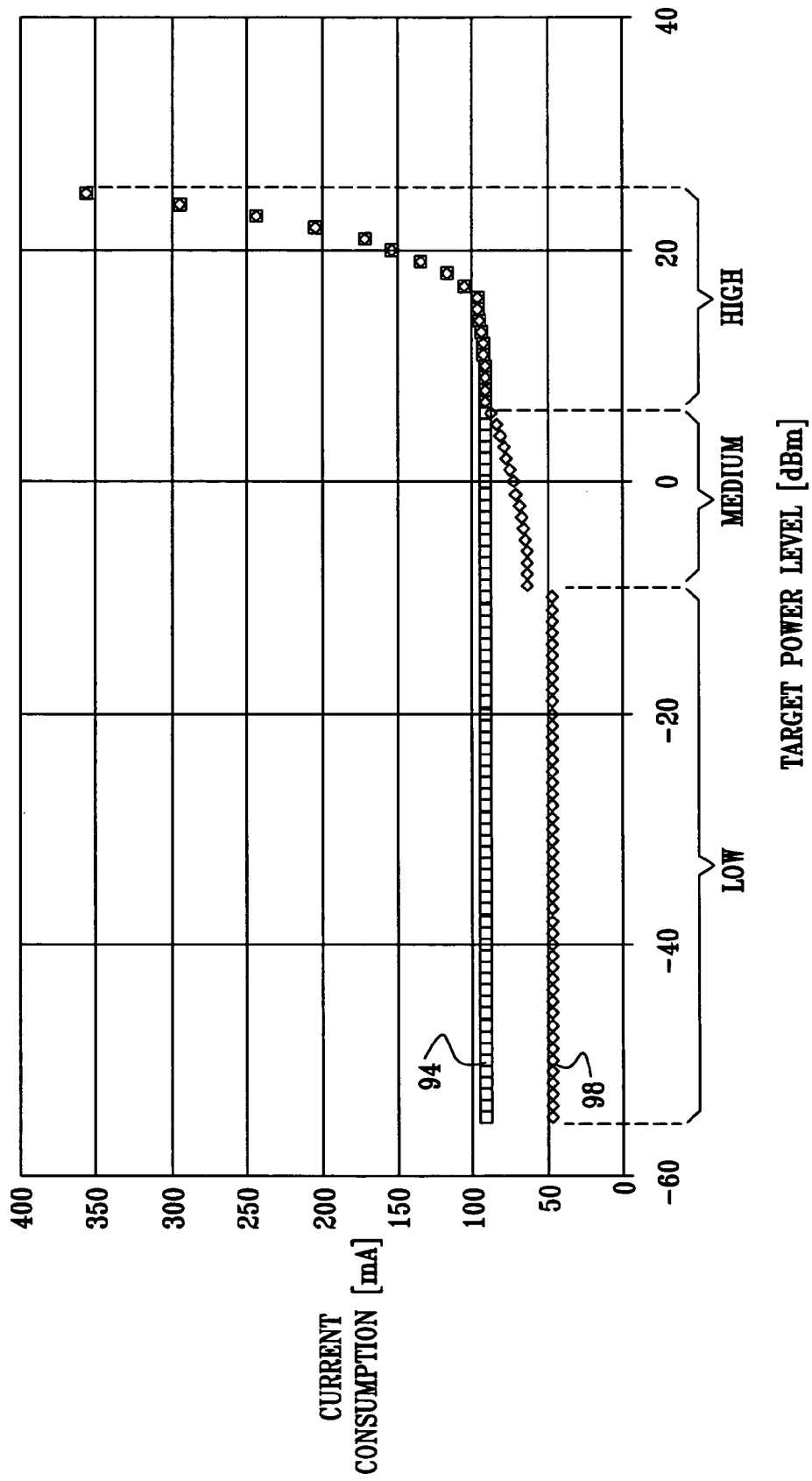

METHOD AND APPARATUS FOR CONTROL OF TRANSMITTER POWER CONSUMPTION

CROSS REFERENCE TO RELATED APPLICATIONS

This application claims priority to co-pending U.S. Provisional Patent Application Ser. No. 60/711,541 filed Aug. 25, 2005, entitled, "Efficient Control of Transmitter Power Consumption," assigned to the assignee of the present application, and also to co-pending U.S. Provisional Patent Application Ser. No. 60/740,038 filed Nov. 28, 2005, entitled, "Efficient Control of Transmitter Power Consumption," also assigned to the assignee of the present application.

FIELD

The method and apparatus herein relates generally to radio frequency (RF) transmitters, and particularly to methods and devices for reducing power consumption in transmitter amplification chains.

BACKGROUND

Mobile wireless communication devices are often required to make efficient use of their power sources in order to extend the lifetime of the power source and/or the device. In many cases, the transmitter circuitry of the mobile device is a major contributor to the power consumption of the device. One typical example is referred to as a low duty cycle (LDC) network. LDC networks comprise LDC terminals, which are small-size communication devices used in a variety of position tracking, tagging, telemetry and similar applications. LDC terminals operate in a hibernation cycle, whereby each terminal wakes-up to receive and transmit data for only a small percentage of the time. This low duty cycle operation minimizes the utilization of the air interface and the energy consumption from the terminal's power source.

SUMMARY

Since mobile wireless devices such as LDC terminals typically comprise a small-size power source on one hand, and are expected to operate for extended periods of time on the other, it is highly desirable to reduce the power consumption of the device.

Aspects of the method and apparatus improve the design and control of amplification stages in a radio frequency (RF) transmitter, so as to reduce its power consumption. In some aspects, the transmitter is operable to transmit an output RF signal at a target power level, which may vary over a wide dynamic range. For each target power level in the dynamic range, a control module in the transmitter configures operational settings of amplification stages of the transmitter in order to produce the output RF signal having the appropriate target power level, while consuming minimal power from the power source. In disclosed aspects, the transmitter is part of a wireless communication device, which also comprises a receiver, and the target power level is determined in response to signals received from a base station. Alternatively, the target power level may be determined by other means.

The operation of amplification stages may be configured in a number of ways, such as controlling the gain and/or the saturation power of amplification stages by controlling their bias voltages, bypassing amplification stages using bypass switches and switching the supply voltage of amplification stages between two or more values.

In some aspects, the dynamic range of transmit power levels is divided into several sub-ranges or intervals. Within each sub-range, a combination of operational settings that consumes minimal power from the power source is determined. During operation, when the transmitter is required to transmit at a certain target power level, the control module determines the sub-range to which the target power level belongs and applies the appropriate operational setting.

In some aspects, the sub-ranges and operational setting combinations are represented using a look-up table (LUT). Alternatively, the sub-ranges and operational setting combinations are represented in terms of a state machine.

The division of the dynamic range into discrete sub-ranges can be optimized with respect to the statistical distribution of transmit power levels over a typical operational profile of the wireless device. The use of this statistical distribution, typically represented as a probability density function (PDF), is explained and demonstrated hereinbelow.

Several exemplary transmitter configurations are described, including configurations suitable for single-band and multiple-band operation, as well as half-duplex and full-duplex applications. Exemplary test results using a simulated PDF show a 20% reduction in average current using the disclosed methods and devices.

The method and apparatus will be more fully understood from the following detailed description, taken together with the drawings in which:

BRIEF DESCRIPTION OF THE DRAWINGS

FIG. 8 is a plot that schematically illustrates current consumption of an LDC terminal transmitter, in accordance with the method and apparatus herein.

DETAILED DESCRIPTION

System Description

Figure 1:
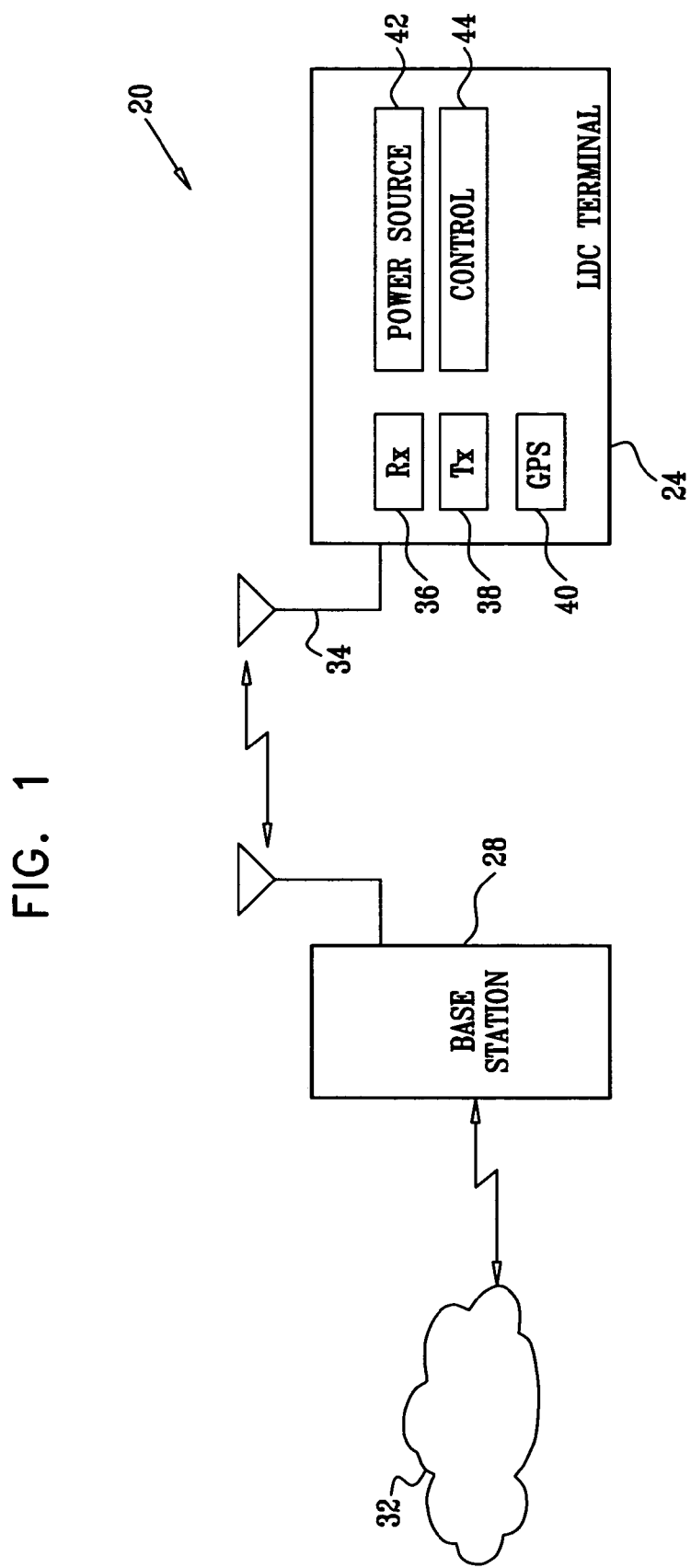
FIG. 1 is a block diagram that schematically illustrates a wireless low duty cycle (LDC) communication system, in accordance with the method and apparatus herein.

FIG. 1 is a block diagram that schematically illustrates a wireless low duty cycle (LDC) communication system 20, in accordance with the method and apparatus herein. LDC system 20 may operate as part of a conventional wireless network, such as a cellular network, for communicating with LDC terminals 24. LDC terminals 24 communicate with base stations 28, which serve as access points to a network 32. The conventional wireless network over which the LDC network is overlaid may comprise, for example, a cellular network, a personal communication system (PCS) or any other suitable public or private wireless network. Different aspects of LDC system 20 can be adapted to use any wireless standard, protocol or air interface used by the conventional wireless network, such as cdmaOne, CDMA2000, UMTS, GSM or any other suitable standard. As such, LDC system 20 can be adapted to operate on any frequency band being used by the conventional wireless network.

Each terminal 24 comprises an antenna 34 for receiving radio frequency (RF) signals from base station 28 and for transmitting RF signals to the base station. The RF signals transmitted by the base station are received, downconverted, filtered, demodulated and otherwise processed by a receiver 36. The specific operation of receiver 36 is outside the scope of the method and apparatus herein. Data to be transmitted from terminal 24 to the base station is modulated, upconverted, filtered and amplified by a transmitter 38 to produce an output RF signal. The output RF signal is then transmitted via antenna 34 to base station 28.

Some LDC applications, such as people and asset tracking, make use of position coordinates of the LDC terminal. In some aspects, terminal 24 comprises a position sensor, such as a global positioning system (GPS) receiver 40. Using the position sensor, terminal 24 is able to determine its position coordinates and transmit this information to the base station.

Terminal 24 is powered by a power source 42, typically comprising a suitable battery. The power source provides electrical power to the transmitter, receiver, GPS receiver and other components of terminal 24. In many LDC applications it is desirable that terminal 24 be capable of operating for an extended period of time, often lasting several months or years, without replacing or recharging power source 42. Typically, transmitter 38 is the dominant consumer of energy from power source 42. Therefore, the different components of terminal 24, and in particular transmitter 38 and its control, should minimize current consumption from the power source.

A control module 44 in terminal 24 performs all control and management functions of the LDC terminal. Among other functions, control module 44 controls the operation of transmitter 38 so as to minimize the current drawn from power source 42, using methods and devices that are described in detail below. Module 44 may be implemented using digital hardware circuitry in an integrated circuit (IC), such as an application-specific IC (ASIC). Alternatively, module 44 can be implemented using software code running on a suitable microprocessor, or using a combination of hardware and software elements.

FIGS. 2-5 are block diagrams that schematically illustrate exemplary configurations of transmitter 38 of LDC terminal 24, in accordance with aspects of the method and apparatus herein. Referring to the exemplary transmitter configuration of FIG. 2, the data to be transmitted from terminal 24 to base station 28 is modulated by a modulator 46, which also filters the signal and upconverts it to a suitable frequency range. The modulated RF signal at the output of modulator 46 is amplified by an amplification chain comprising two amplification stages connected in cascade, namely a driver amplifier (DA) 48 and a power amplifier (PA) 50.

Figure 2:
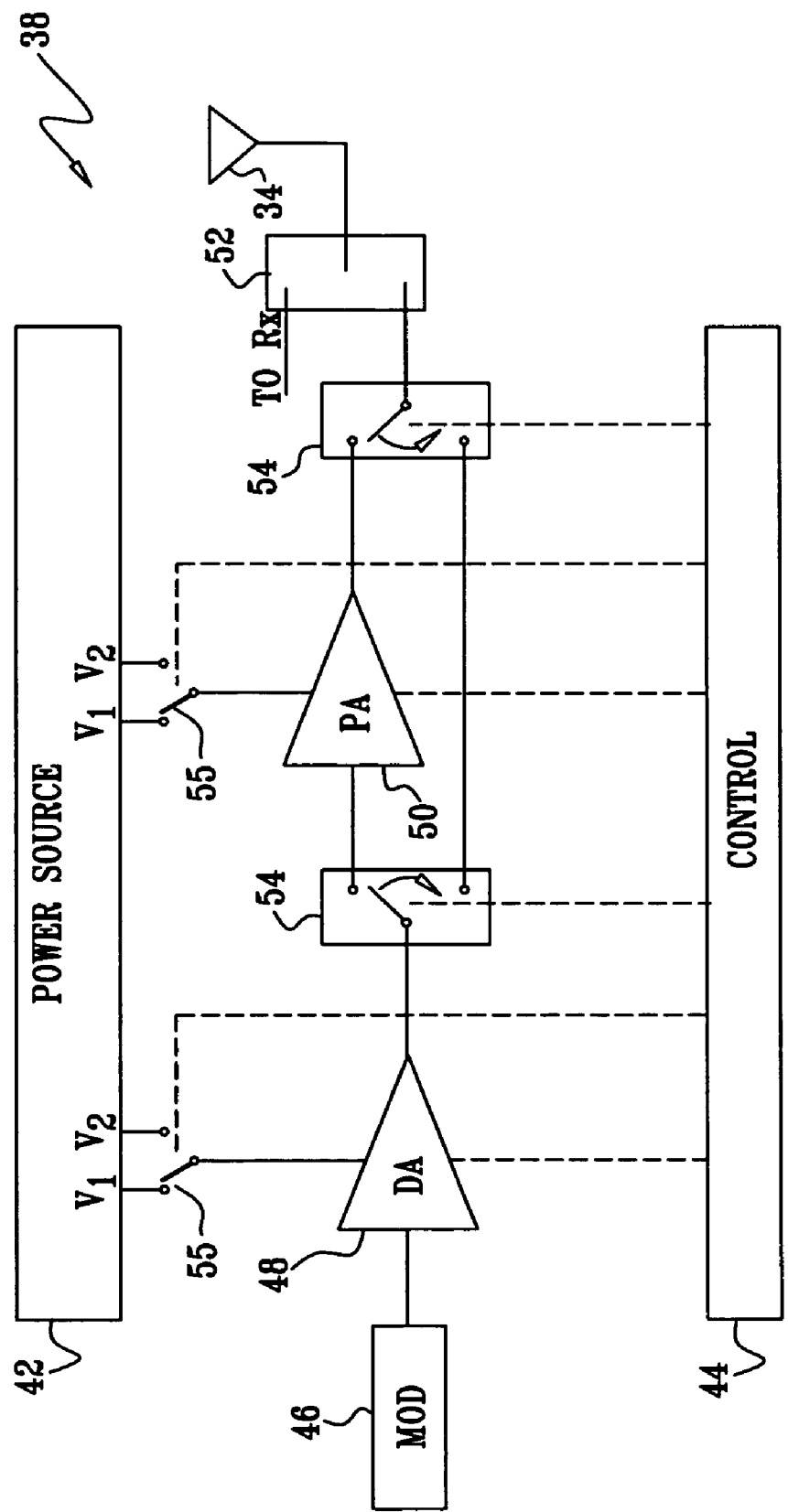
FIGS. 2-5 are block diagrams that schematically illustrate LDC terminal transmitter configurations, in accordance with the method and apparatus herein.

The power amplifier produces an output RF signal that is transmitted to base station 28 via antenna 34. Although FIG. 2 shows two amplification stages for the sake of clarity, the methods and devices described herein can be used in amplification chains comprising any number of amplification stages. The amplification stages may be connected in cascade, in parallel configurations or in mixed configurations of parallel and cascaded connections.

In some aspects, the air interface or protocol used by LDC system 20 is a full-duplex protocol, in which terminal 24 transmits and receives RF signals simultaneously on two different channels. In other aspects, the protocol is a half-duplex protocol, in which the terminal alternates between transmission and reception, typically on the same frequency. A duplexer 52 filters the transmit and receive frequency ranges, as is known in the art. One output of duplexer 52 provides the RF signals received by antenna 34 to receiver 36.

The use of a duplexer is suitable for both full-duplex and half-duplex operation. Alternative configurations suitable for half-duplex operation, in which the duplexer is replaced by a switch, are described below.

In some aspects, transmitter 38 is operable to transmit the output RF signal at a certain transmit power level, which may vary over a wide dynamic range. A typical dynamic range of transmit power levels is on the order of 80 dB, such as from −55 dBm up to +27 dBm. The transmit power level may depend, for example, on the range and path loss of the communication channel between terminal 24 and base station 28, the desired signal-to-noise ratio, etc.

In many practical cases, base station 28 provides terminal 24 with a target power level to use for transmitting the output RF signal. In some aspects, the base station indicates an absolute target power level. In other aspects, the base station instructs the terminal to increase or decrease the output RF signal power by a predetermined incremental step size. The specific format of the instruction depends on the protocol defined between terminal 24 and base station 28. In still other aspects, LDC terminal 24 determines the target power level by itself, for example responsively to the level of the RF signal received from the base station. For each target power level in the predefined dynamic range, control module 44 configures operational settings of the amplification stages of transmitter 38 in order to produce the output RF signal having the required target power level, while consuming minimal power from power source 42.

The operation of amplification stages can be configured responsively to the target power level in a number of ways. In some aspects, module 44 controls the gain and/or the saturation power of one or more of the amplification stages by controlling bias voltages applied to the stages. Typically, when an amplification stage is biased to have a lower saturation power, its current consumption is reduced. Module 44 can either switch the bias voltage between two or more predetermined values, or alternatively provide a continuous range of bias voltages.

Additionally or alternatively, module 44 can bypass one or more amplification stages using bypass switches 54. In the transmitter configuration of FIG. 2, two bypass switches are coupled to the input and output of power amplifier 50, so as to enable control module 44 to bypass the PA when appropriate. In some aspects, when a stage is bypassed its supply voltage is also turned off to further reduce power consumption.

Further additionally or alternatively, module 44 can switch the supply voltage of one or more amplification stages between two or more values using DC switches 55. In the embodiment shown in FIG. 2, both driver amplifier 48 and power amplifier 50 are connected to outputs of power source 42 via such DC switches, controlled by module 44. In this aspect, power source 42 comprises a dual-voltage source. For example, the supply voltage can be switched between a high voltage of 3.4V and a low voltage of 1.5V. Although switches 55 are shown in the figures, for the sake of clarity, as being separate from power source 42, these switches may alternatively be integrated within the power source itself. Additionally or alternatively, module 44 can configure any other suitable operational setting or combination of settings in any of the amplification stages of the transmitter.

In some cases, when determining the operational settings, there is a trade-off between minimization of power consumption and between maintaining the quality of the output RF signal. For example, lowering the supply voltage or the bias voltage of an amplification stage may degrade the linearity of the stage at the target power level. The degraded linearity may cause intermodulation distortion and other undesirable spurious emissions. Therefore, determining the operational settings may also allow for signal quality considerations.

In some cases, switching the supply voltage or bias voltage of an amplification stage may introduce transient distortion, in particular phase distortion, into the amplified signal during voltage variation. Bypassing an amplification stage can also introduce a switching transient. These effects can be taken into account, especially in full-duplex applications, in which it is sometimes desirable to modify operational settings during transmission. In half-duplex applications, it is often possible to modify the operational settings when the transmitter is idle (such as during protocol guard-times or during reception), thereby avoiding transient distortion.

Figure 3:
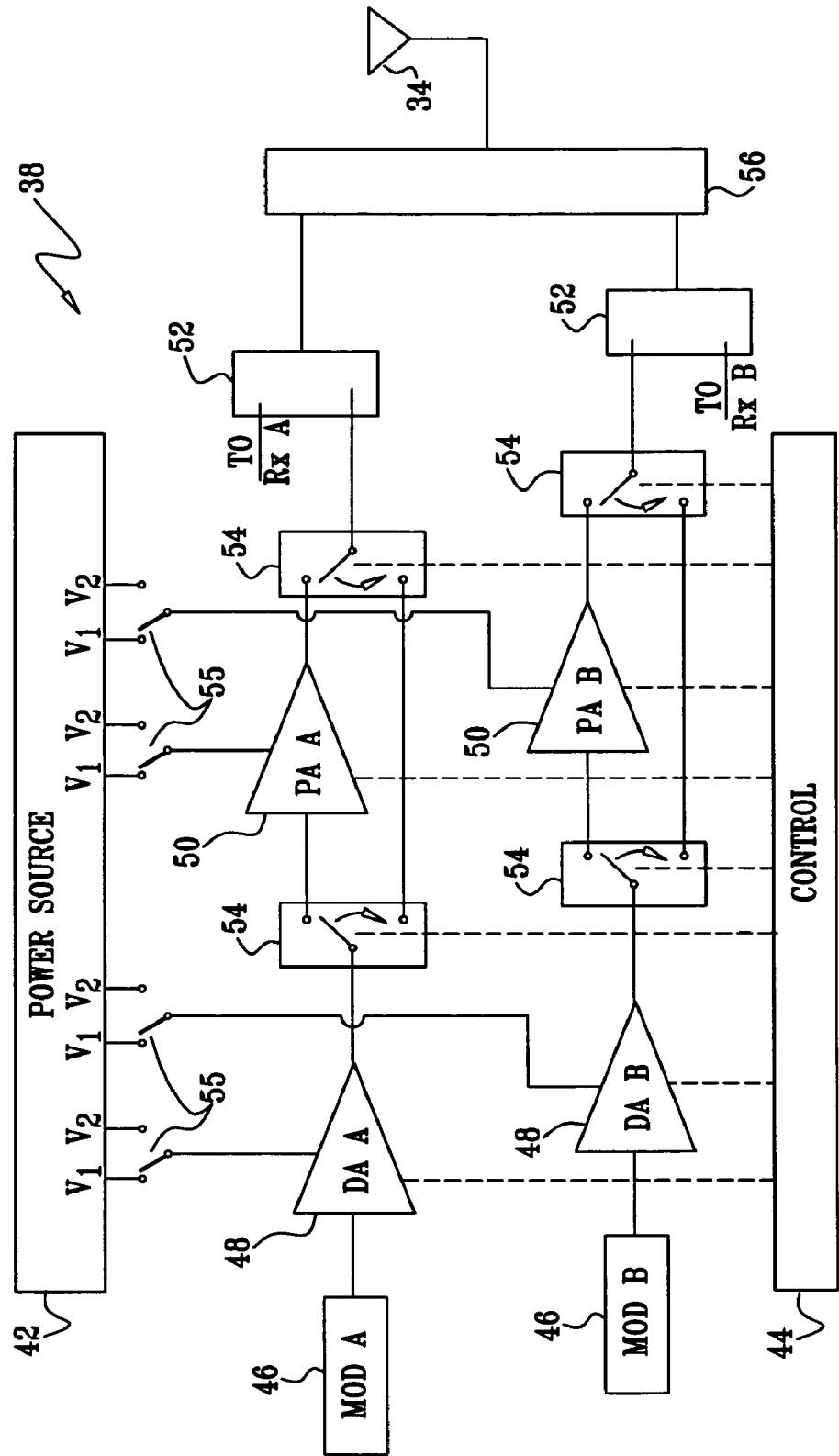

FIG. 3 shows another transmitter configuration, in accordance with the method and apparatus herein. The transmitter configuration of FIG. 3 is a multiple-band configuration comprising two amplification chains. Each amplification chain is similar in structure to the configuration of FIG. 2 above. A first amplification chain (comprising the driver amplifier labeled DA A and the power amplifier labeled PA A and driven by the modulator labeled MOD A) transmits on one frequency band, such as a cellular frequency band around 800 or 900 MHz. A second amplification chain (comprising the driver amplifier labeled DA B and the power amplifier labeled PA B and driven by the modulator labeled MOD B) transmits on another frequency band, such as a PCS frequency band around 1800 or 1900 MHz. A diplexer 56 connects the two amplification chains to antenna 34. As in FIG. 2 above, control module 44 configures the bias voltages and supply voltages of driver amplifiers 48 and power amplifiers 50, as well as bypasses power amplifiers 50 when appropriate.

In an alternative aspect (not shown in the figures) the two bypass switches in FIG. 3 can be replaced by a single-pole four-throw (SP4T) switch that performs both bypassing and band selection. The output of the SP4T switch is fed through a single duplexer 52 to the antenna. The receiver-side output of duplexer 52 is provided to both Rx A and Rx B.

It will be understood by those skilled in the art that other multiple-band transmitter configurations are also within the scope of the method and apparatus described herein, such as but not limited to, a device which transmits on a cellular frequency band, a PCS frequency band, and a GSM 900 MHz band.

Figure 4:
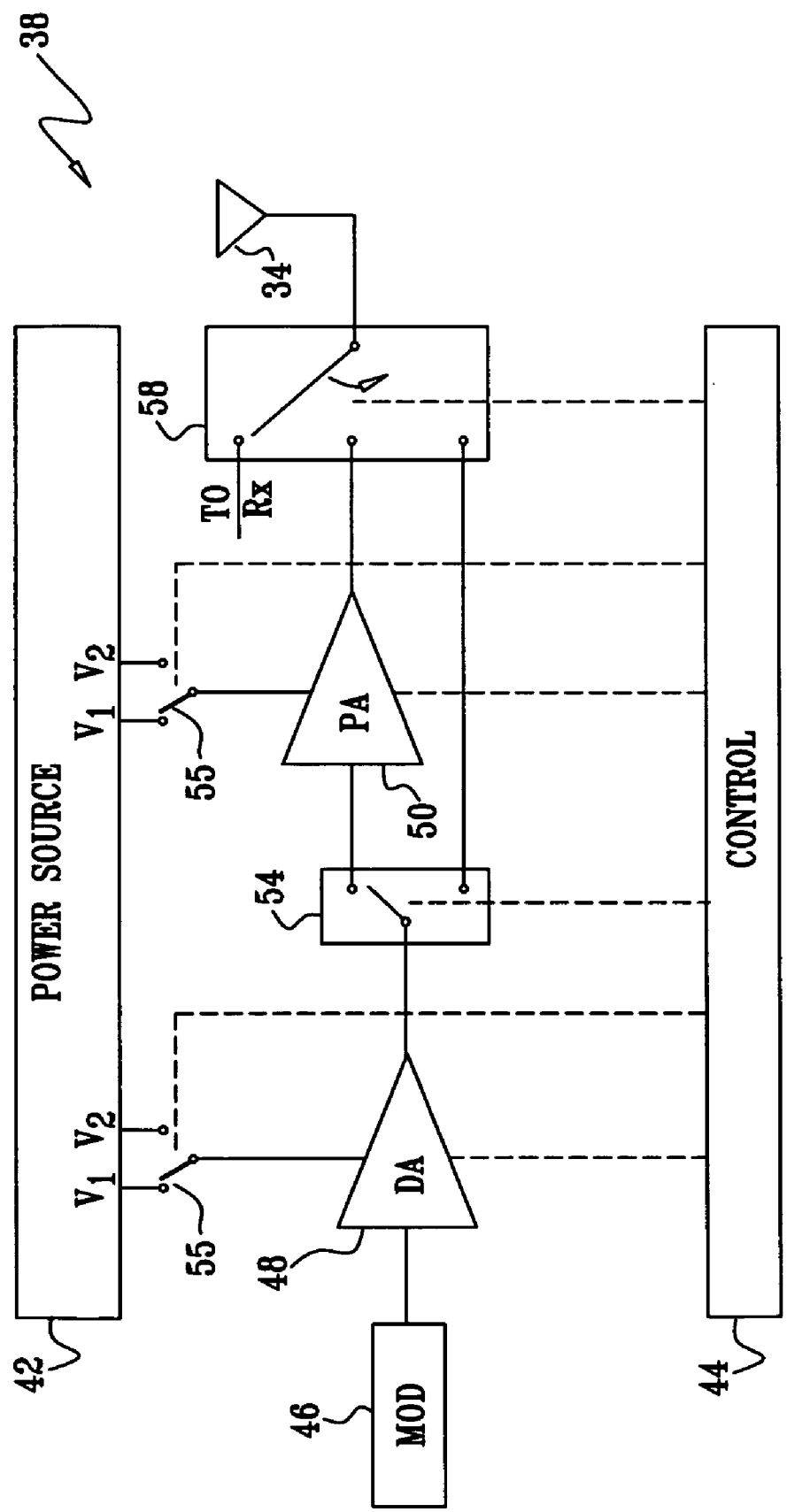

FIG. 4 shows another exemplary transmitter configuration, which is particularly suitable for half-duplex operation. In the configuration of FIG. 4, a single-pole triple-throw (SP3T) switch 58 controlled by module 44 combines two functions: bypassing of PA 50 in transmit mode and switching antenna 34 between transmitter 38 and receiver 36, thereby replacing duplexer 52. This configuration provides better transmitter efficiency in comparison with the configuration of FIG. 2 above, because it reduces the insertion losses between the output of PA 50 and antenna 34. However, the SP3T switch configuration can only be used in half-duplex operation, since the switch connects the antenna to either transmitter 38 or to receiver 36, but not to both simultaneously.

Figure 5:
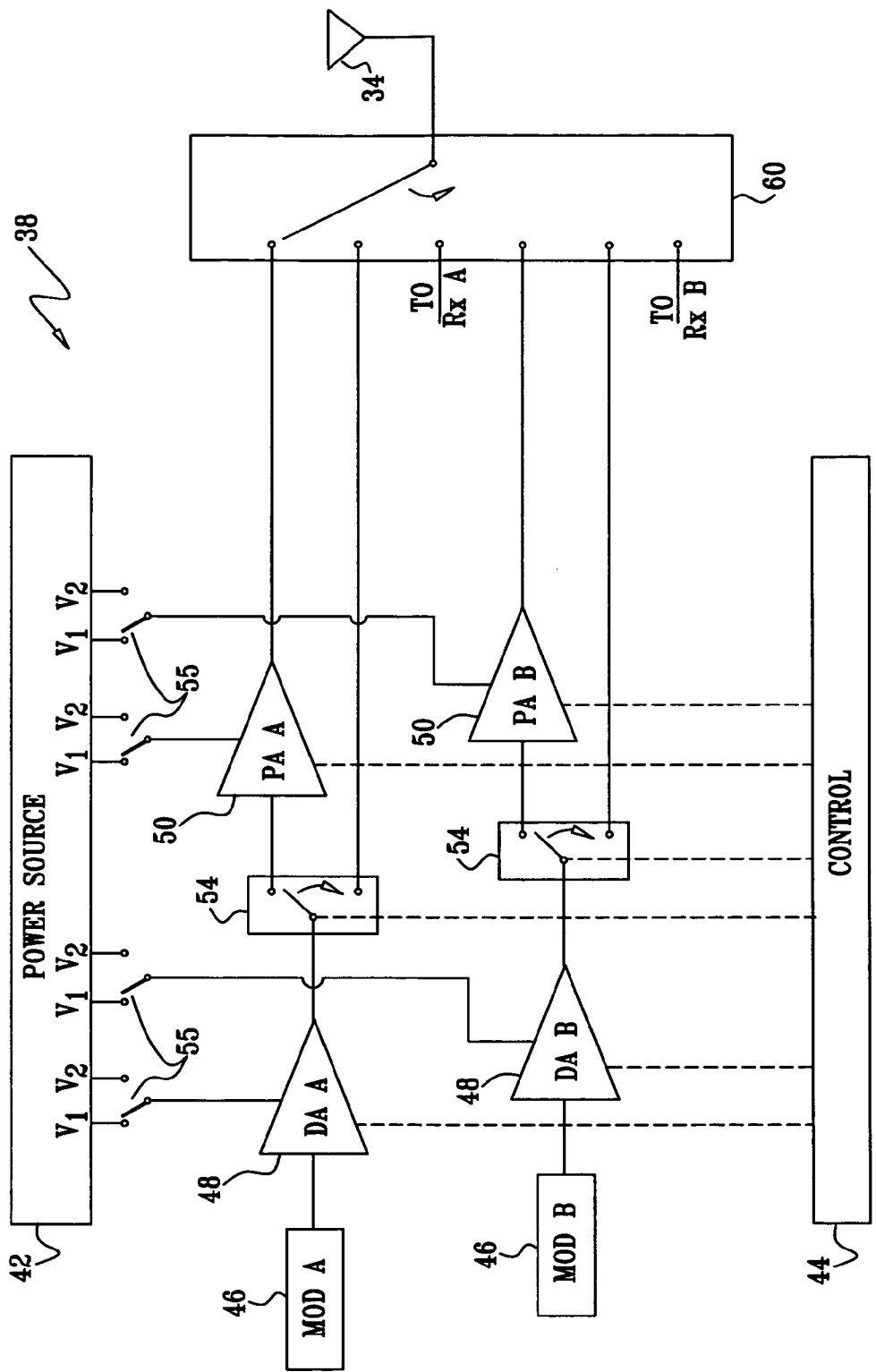

FIG. 5 shows another multiple-band configuration suitable for half-duplex operation. The figure shows two amplification chains controlled by module 44, similar to the configuration of FIG. 3. Similarly to the half-duplex configuration of FIG. 4, the duplexers 52 are replaced by a switch. In the configuration shown in FIG. 5, a single-pole six-throw (SP6T) switch 60 replaces the two duplexers 52 and diplexer 56 shown in FIG. 3. SP6T switch 60 thus performs PA bypassing of both PA A and PA B, as well as band selection. This configuration is sometimes preferable in half-duplex scenarios because of the low insertion loss between the outputs of PAs 50 and antenna 34.

In all of the configurations shown in FIGS. 2-5 above, some of the transmitter circuitry can be integrated in an RF integrated circuit (RFIC) to reduce cost, size, chip count and power consumption. For example, modulator 48 and driver amplifier 48 (or two such chains, as in the multiple-band configurations of FIGS. 3 and 5) can be integrated in an RFIC. In some aspects, the bypass switch coupled to the input of PA 50 can also be integrated into the RFIC.

In some aspects, power amplifier 50 comprises an integrated, commercially-available amplifier unit. Such amplifier units often comprise two or more cascaded amplification stages integrated with externally-controllable bypass switches and/or means for external bias control.

Control Module Operation

As noted above, for each target power level in the dynamic range defined for LDC terminal 24, control module 44 determines one or more operational settings of the amplification stages, so that the output RF signal has the required transmit power level while minimizing the current drawn from power source 42.

In some aspects, module 44 divides the dynamic range of transmit power levels into several sub-ranges. Within each sub-range, module 44 determines a combination of operational settings that minimize the power consumption from power source 42. During operation, when the LDC terminal is required to transmit at a certain target power level, module 44 determines the sub-range to which this target power level belongs and applies the appropriate operational settings.

In some aspects, the sub-ranges and operational setting combinations are represented using a look-up table (LUT), which is accessed according to the required transmit power level. For each target power level, the LUT holds the definition of the operational settings that should be set, e.g., whether a certain amplification stage should be bypassed, and values of supply voltages and bias voltages of the amplification stages. Alternatively, the sub-ranges and operational setting combinations can be represented in terms of a state machine. Each state of the state machine corresponds to a sub-range of the dynamic range.

Figure 6:
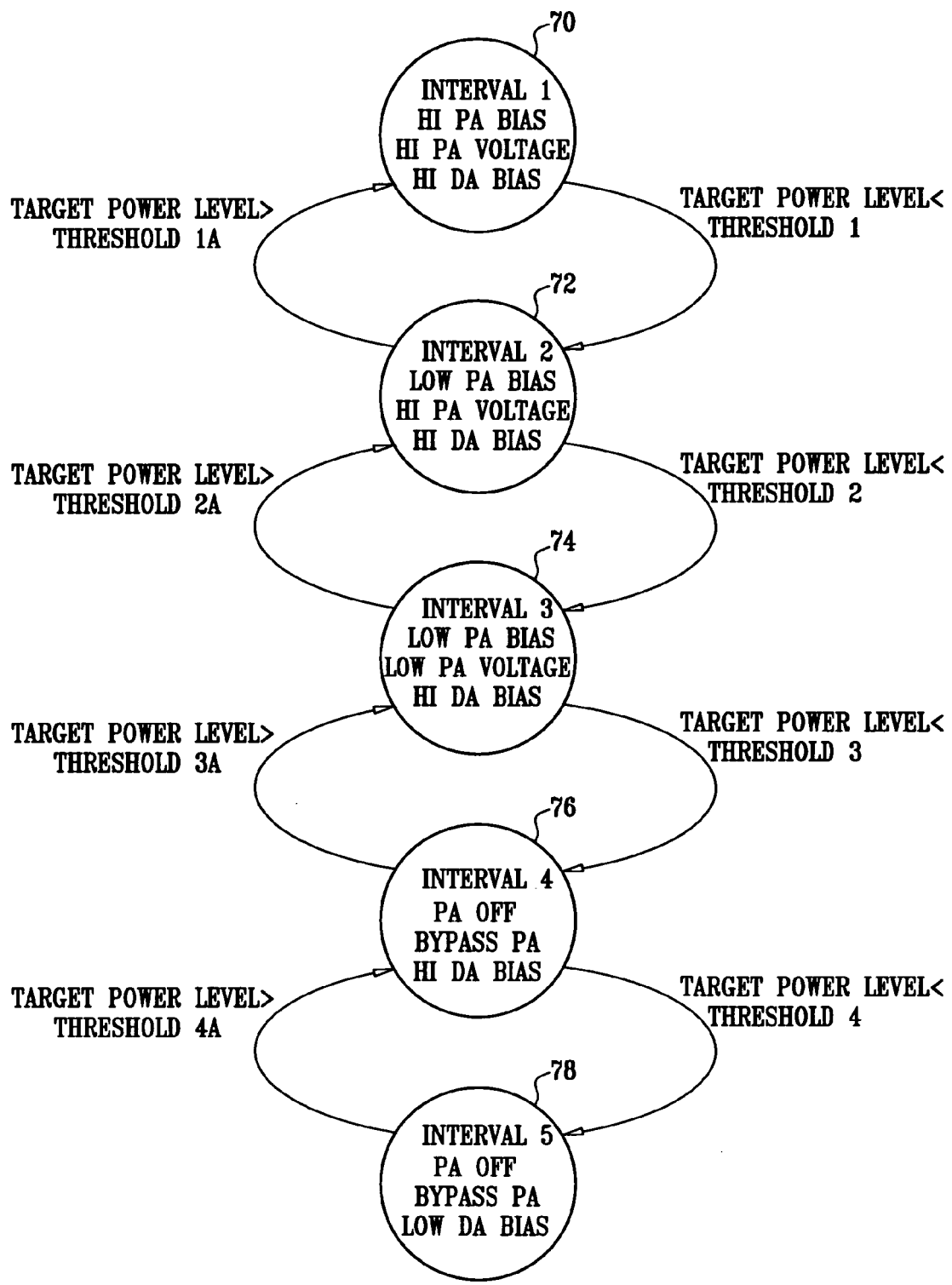
FIG. 6 is a state diagram that schematically illustrates operational states of an LDC terminal transmitter, in accordance with the method and apparatus herein.

FIG. 6 is an exemplary state diagram that schematically illustrates operational states of transmitter 38, in accordance with the method and apparatus herein. The state machine shown in FIG. 6 corresponds to a transmitter configuration comprising one driver amplifier (DA) and one power amplifier (PA). In the present example, the PA supply voltage can be switched between two values denoted "high" and "low." The bias voltage of the PA and of the DA can be (independently of one another) switched between two values denoted "high" and "low." The PA can also be bypassed. When the PA is bypassed, its supply voltage is turned off to further reduce power consumption.

The dynamic range of transmit power levels is divided into five sub-ranges, or intervals, represented by five operational states. Each state corresponds to a particular combination of the operational settings. For example, a very high power state 70 corresponds to an interval of the highest transmit power levels in the dynamic range. When in state 70 (i.e., when the target power level is within the corresponding interval), module 44 sets a high bias voltage and a high supply voltage to PA 50, and a high bias voltage to DA 48. The following table gives the operational settings for each of the five states in the state machine of FIG. 6:

| State # | Target power level | PA bias voltage | PA supply voltage | PA bypass | DA bias voltage |
|---|---|---|---|---|---|
| 70 | Very high | High | High | No | High |
| 72 | High | Low | High | No | High |
| 74 | Medium | Low | Low | No | High |
| 76 | Low | NA | Off | Yes | High |
| 78 | Very low | NA | Off | Yes | Low |

Transitions between operational states in the state machine are defined using thresholds. Downward thresholds denoted "THRESHOLD 1" through "THRESHOLD 4" define downward transitions, i.e., transitions from higher power states to lower power states. Upward thresholds denoted "THRESHOLD 1A" through "THRESHOLD 4A" define upward transitions, or transitions from lower power states to higher power states. Each upward threshold is slightly higher than its respective downward threshold, in order to introduce some hysteresis into the state machine transitions. The hysteresis mechanism avoids situations of repetitive transitions, or oscillations, when the target power level is close to a threshold value.

In alternative aspects, the state machine may comprise a single set of thresholds with no hysteresis. Further alternatively, the state machine may comprise any number of operational states, and each state can have any suitable definition of operational settings.

During operation of the LDC terminal, when the terminal is required to transmit at a certain target power level, module 44 compares this target power level to the thresholds of the two transitions that come out of the current operational state. Responsively to the comparison, module 44 can either move up to the adjacent higher state, move down to the adjacent lower state or remain in the same state. In alternative aspects, the state machine may comprise transitions to non-adjacent states, so as to enable rapid changes of the target power level.

Power Level Statistics Considerations

In some aspects, the division of the dynamic range into discrete sub-ranges takes into account the statistical distribution of transmit power levels. In some LDC applications it is possible to estimate, measure or model the statistical distribution of transmit power levels over a typical operational profile of the LDC terminal. This statistical distribution, typically represented as a probability density function (PDF), can be used to optimize the division of the dynamic range into sub-ranges and the definition of the operational settings within each sub-range. Typically, this optimization is performed during the design of the terminal configuration, before mass-production.

In some aspects, particularly when control module 44 is implemented using digital hardware circuitry in an ASIC, a large number of sub-ranges and combinations of operational settings may require a larger, more complex ASIC. In these aspects, the optimization process described above can be advantageous for reducing the number of sub-ranges (or operational states in the state machine) and the number of combinations of operational setting values. Using the PDF can help to reduce the number of sub-ranges and operational setting combinations, with minimal degradation in power consumption. Similarly, it may be found that certain switches in the basic design of the transmitter are not actually needed to implement any of the operational states. These switches may then be eliminated from the mass-produced terminal, thus reducing chip area and cost.

Figure 7:
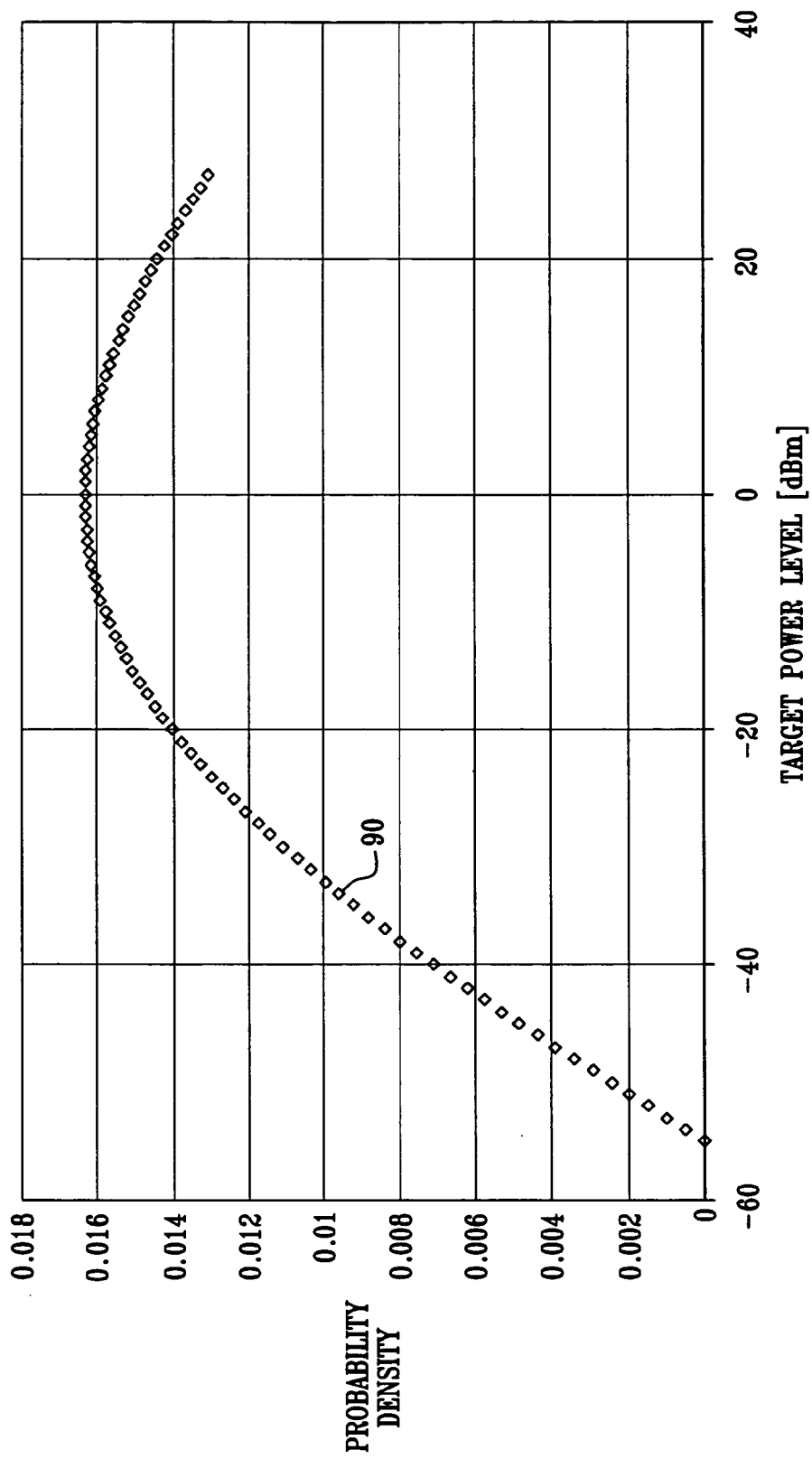
FIG. 7 is a plot that schematically illustrates a probability density function (PDF) of output power levels, in accordance with the method and apparatus herein.

FIG. 7 is a plot that schematically illustrates an exemplary probability density function (PDF) of target power levels, in accordance with the method and apparatus herein. The horizontal axis of FIG. 7 shows the dynamic range of transmit power levels, in this example from −55 dBm to +27 dBm. Data points 90 give the probability density of occurrence of each transmit power level. It can be seen that the most commonly-occurring transmit power levels are concentrated approximately between −20 dBm and +20 dBm, with 0 dBm being the most common target power level.

In an exemplary design process, the average current consumption of the transmitter from power source 42, denoted $\bar{I}$, is estimated using the PDF. The average current consumption can be written as:

$$\bar{I} = \int_P I(p) f(p) dp \qquad [1]$$

wherein P denotes the range of transmit power levels, I(p) denotes the current consumption at transmit power level p, and f(p) denotes the PDF of transmit power levels described above. Integration is performed over the entire dynamic range P.

When the dynamic range is divided into discrete sub-ranges, each with a certain set of operational settings, as described above, I(p) is then constant within each sub-range and its value is determined by the operational settings determined for the sub-range by module 44. Using the above equation, the number of sub-ranges, sub-range boundaries and the current consumption within each sub-range can be optimized so as to minimize the average current consumption $\bar{I}$.

The optimization of $\bar{I}$ for a given number of sub-ranges may increase the current consumption in some rarely-occurring transmit power levels, while decreasing the current consumption in the more commonly-occurring power levels. Additionally or alternatively, the division to sub-ranges can be selected so as to give more emphasis to commonly-occurring transmit power levels.

FIG. 8 is a plot that schematically illustrates current consumption of an LDC terminal transmitter 38, in accordance with the method and apparatus herein. The horizontal axis of FIG. 8 shows the dynamic range of transmit power levels, in this example from −55 dBm to +27 dBm. The vertical axis gives the current consumption of the transmitter from power source 42. The power source in this example is a 2.85V battery.

The exemplary transmitter configuration whose performance is shown in FIG. 8 comprises a driver amplifier and a power amplifier connected in cascade. The power amplifier comprises an integrated device comprising two internal stages. The second internal stage of the PA can be bypassed using external control. The following table describes the three operational states defined in the present example:

| State (power level range) | Operational settings |
|---|---|
| High | DA operative, PA operative. |
| Medium | DA operative, second PA stage bypassed. |

-continued

| State (power level range) | Operational settings |
|---|---|
| Low | Only DA operative. Entire PA bypassed and turned off. |

Two thresholds are defined for determining transitions between operational states. Transitions between the High and Medium states occur at 7 dBm and transitions between the Medium and Low states occur at −9 dBm. The sub-ranges corresponding to the three operational states are indicates along the horizontal axis of FIG. 8.

Data points 94 give the current consumption of a reference configuration, in which there is no adaptive modification of operational settings. In the reference configuration, the DA and both stages of the PA are constantly operative, regardless of the target power level. Data points 98 give the current consumption when the operational settings are determined responsively to the target power level, in accordance with the method and apparatus herein.

Comparing the two sets of data points shows the effectiveness of the disclosed methods and devices in reducing transmitter power consumption. In the "High" state, both configurations are identical and therefore consume the same current from power source 42. In the "Medium" state, the reference configuration consumes 92 mA at 2.85 V, while the adaptive configuration consumes between 87 mA and 63 mA, depending on the target power level. In the "low" state, the reference configuration still consumes 92 mA at 2.85 V, while the adaptive configuration consumes only 47 mA.

The adaptive configuration in FIG. 8 is based on the probability function shown in FIG. 7 above. Using equation [1] above, the average current consumption $\bar{I}$ was calculated for both configurations. For the reference configuration, $\bar{I}$=118.8 mA while in the adaptive configuration $\bar{I}$=94.2 mA, both at 2.85 V. The average current saving over a typical operational profile of the LDC terminal in this example is 24.6 mA, which amounts to a 20% reduction.

Although the methods and devices described herein relate mainly to controlling amplification stages in an LDC terminal, the principles of the method and apparatus herein can also be used for reducing power consumption in other types of power amplification applications, in which low power consumption is desirable. Such applications may comprise, for example, cellular handsets, radio frequency identification (RFID) transponders and satellite transmitters.

It will thus be appreciated that the aspects described above are cited by way of example, and that the method and apparatus herein is not limited to what has been particularly shown and described hereinabove. Rather, the scope of the method and apparatus herein includes both combinations and sub-combinations of the various features described hereinabove, as well as variations and modifications thereof which would occur to persons skilled in the art upon reading the foregoing description and which are not disclosed in the prior art.

The invention claimed is:

1. A method for controlling a radio frequency (RF) transmitter that includes one or more amplification stages, the method comprising:

defining a range of transmit power levels over which the transmitter is required to operate;

determining a statistical distribution of a typical operational profile of the transmit power levels in the range that is expected to occur during use of the transmitter;

dividing the range into a plurality of sub-ranges based upon the statistical distribution and determining, for each sub-range, one or more operational settings of at least one of the amplification stages; and configuring the transmitter to determine a target power level of an output RF signal during the use of the transmitter and to apply the one or more operational settings depending upon the sub-range in which the target power level falls.

2. The method according to claim 1, wherein dividing the range and determining the operational settings comprise choosing the sub-ranges and settings so as to reduce electrical power drawn by the transmitter in view of the statistical distribution.

3. The method according to claim 1, wherein the one or more amplification stages have a set of configurable parameters, and wherein determining the operational settings comprises choosing a subset of the parameters to which the operational settings are to apply, and disabling configurability of at least one of the parameters that is not in the subset.

4. The method according to claim 1, wherein the RF transmitter is part of a low duty-cycle (LDC) terminal in a LDC network.

5. The method according to claim 1, wherein the one or more operational settings comprise at least one of a supply voltage, a bias voltage and a bypass condition, and wherein configuring the transmitter comprises at least one of modifying a supply voltage, modifying a bias voltage and bypassing at least one of the one or more amplification stages.

6. The method according to claim 5, wherein at least one of the operational settings comprises the bypass condition, wherein the transmitter is operated in accordance with a half-duplex protocol alternating between a reception mode and a transmission mode, and wherein configuring the transmitter comprises applying the bypass condition to bypass the at least one of the one or more amplification stages and alternating between the reception mode and the transmission mode using a single RF switch.

7. The method according to claim 5, wherein at least one of the operational settings comprises the bypass condition, wherein the transmitter comprises a multiple-band transmitter coupled to transmit on one of multiple frequency bands, and wherein configuring the transmitter comprises applying the bypass condition to bypass the at least one of the one or more amplification stages and selecting one of the multiple frequency bands using an RF switch.

8. The method according to claim 1, wherein dividing the range comprises reducing at least one of a number of the sub-ranges and the number of the operational settings responsively to the statistical distribution.

9. The method according to claim 1, wherein configuring the transmitter comprises programming the transmitter to select the operational settings using at least one of a state machine and a look-up table (LUT).

10. A radio frequency (RF) transmitter, comprising:

one or more amplification stages, which are arranged to produce an output RF signal, wherein at least one of the amplification stages is configurable using one or more operational settings, and wherein the one or more operational settings are determined by defining a range of transmit power levels over which the transmitter is required to operate, determining a statistical distribution of a typical operational profile of the transmit power levels in the range that is expected to occur during use of the transmitter, dividing the range into a plurality of sub-ranges based upon the statistical distribution, and determining, for each sub-range, the one or more operational settings of at least one of the amplification stages; and a control module, which is arranged to determine a target power level of the output RF signal during the use of the transmitter and to apply the one or more operational settings to the at least one of the amplification stages depending upon the sub-range in which the target power level falls.

11. The transmitter according to claim 10, and comprising a power source, which is arranged to provide electrical power for operating the transmitter, wherein the sub-ranges and settings are chosen so as to reduce electrical power drawn by the transmitter from the power source in view of the statistical distribution.

12. The transmitter according to claim 10, wherein the one or more amplification stages have a set of configurable parameters, and wherein the sub-ranges and settings are chosen so as to select a subset of the parameters to which the operational settings are to apply, and disabling configurability of at least one of the parameters that is not in the subset.

13. The transmitter according to claim 10, wherein the transmitter is further coupled to operate as part of a low duty-cycle (LDC) terminal in a LDC network.

14. The transmitter according to claim 10, wherein the one or more operational settings comprise at least one of a supply voltage, a bias voltage and a bypass condition, and wherein the control module is coupled to apply the one or more operational settings by performing at least one of modifying a supply voltage, modifying a bias voltage and bypassing at least one of the one or more amplification stages.

15. The transmitter according to claim 14, wherein at least one of the operational setting comprises the bypass condition, wherein the transmitter is operated in accordance with a half-duplex protocol alternating between a reception mode and a transmission mode, and comprising an RF switch controlled by the control module, the switch coupled to apply the bypass condition to bypass the at least one of the one or more amplification stages, and to alternate between the reception mode and the transmission mode.

16. The transmitter according to claim 14, wherein at least one of the operational settings comprises the bypass condition, wherein the transmitter comprises a multiple-band transmitter coupled to transmit on one of multiple frequency bands, and comprising an RF switch controlled by the control module, the switch coupled to apply the bypass condition to bypass the at least one of the one or more amplification stages, and to select one of the multiple frequency bands.

17. The transmitter according to claim 10, wherein the sub-ranges are represented using at least one of a state machine and a look-up table (LUT).

18. A half-duplex transmitter, which is configured to alternate between a reception mode and a transmission mode, the transmitter comprising:
a transmission circuit, which is operative to produce an output signal for transmission in the transmission mode, the transmission circuit comprising an amplification stage;
a reception circuit, which is operative to receive an input signal in the reception mode;
a switch, which is coupled to the transmission and reception circuits so as both to switch between the reception mode and the transmission mode and to selectably bypass the amplification stage in the transmission mode; and
a control module, which is arranged to determine a target power level of the output signal and to control actuation of the switch so as to select the transmission or the reception mode and, responsively to the target power level, to bypass the amplification stage in the transmission mode, wherein the control module is arranged to determine whether to bypass the amplification stage depending on a sub-range in which the target power level falls, the sub-range being selected from a plurality of sub-ranges, wherein the sub-ranges are defined by determining a range of transmit power levels over which the transmitter is required to operate, determining a statistical distribution of a typical operational profile of the transmit power levels in the range that is expected to occur during use of the transmitter and dividing the range into a plurality of sub-ranges based upon the statistical distribution.

19. The transmitter according to claim 18, wherein the switch is a single-pole switch, having at least a first throw position for the reception mode, a second throw position for accepting the output signal in the transmission mode from the amplification stage, and a third throw position for accepting the output signal in the transmission mode while bypassing the amplification stage.

20. A transmitter, comprising:
a first amplification stage, which is coupled to produce a first output signal in a first frequency band;
a second amplification stage, which is coupled to produce a second output signal in a second frequency band;
an RF switch, which is coupled both to selectably bypass the first and second amplification stages and to select between the first and second frequency bands; and
a control module, which is arranged to determine a target power level of at least one of the first and second output signals and to control actuation of the switch so as to select between the first and second frequency bands and, responsively to the target power level, to bypass at least one of the first and second amplification stages, wherein the control module is arranged to determine whether to bypass the at least one of the first and second amplification stages depending on a sub-range in which the target power level falls, the sub-range being selected from a plurality of sub-ranges, wherein the sub-ranges are defined by determining a range of transmit power levels over which the transmitter is required to operate, determining a statistical distribution of a typical operational profile of the transmit power levels in the range that is expected to occur during use of the transmitter and dividing the range into a plurality of sub-ranges based upon the statistical distribution.

21. The transmitter according to claim 20, wherein the switch is a single-pole switch, having at least a first throw position for accepting the first output signal while not bypassing the first amplification stage, a second throw position for accepting the second output signal while not bypassing the second amplification stage, and a third throw position for accepting one of the first and second output signals while bypassing at least one of the first and second amplification stages.

22. A transmitter, comprising:
means for defining a range of transmit power levels over which the transmitter is required to operate;
means for determining a statistical distribution of a typical operational profile of the transmit power levels in the range that is expected to occur during use of the transmitter;
means for dividing the range into a plurality of sub-ranges based upon the statistical distribution and determining, for each sub-range, one or more operational settings of at least one of the amplification stages; and means for configuring the transmitter to determine a target power level of an output RF signal during the use of the transmitter and to apply the one or more operational settings depending upon the sub-range in which the target power level falls.

* * * * *